United States Patent
Luo et al.

(10) Patent No.: US 10,089,515 B2
(45) Date of Patent: Oct. 2, 2018

(54) ORGANIC LIGHT-ENITTING DIODE DISPLAY PANEL FOR FINGERPRINT RECOGNITION AND ELECTRONIC DEVICE

(71) Applicant: NANCHANG O-FILM BIO-IDENTIFICATION TECHNOLOGY CO., LTD., Nanchang (CN)

(72) Inventors: Jianfeng Luo, Nanchang (CN); Saixin Guan, Nanchang (CN)

(73) Assignee: NANCHANG O-FILM BIO-IDENTIFICATION TECHNOLOGY CO., LTD., Nanchang (CN)

( * ) Notice: Subject to any disclaimer, the term of this patent is extended or adjusted under 35 U.S.C. 154(b) by 0 days.

(21) Appl. No.: 15/585,036

(22) Filed: May 2, 2017

(65) Prior Publication Data
US 2018/0150669 A1 May 31, 2018

(30) Foreign Application Priority Data
Nov. 28, 2016 (CN) .......................... 2016 1 1062840

(51) Int. Cl.
*G06K 9/00* (2006.01)
*H01L 27/32* (2006.01)

(52) U.S. Cl.
CPC ......... *G06K 9/0004* (2013.01); *G06K 9/0008* (2013.01); *H01L 27/3234* (2013.01)

(58) Field of Classification Search
CPC . G06K 9/0004; G06K 9/0008; H01L 27/3234
See application file for complete search history.

(56) References Cited

U.S. PATENT DOCUMENTS

| | | | |
|---|---|---|---|
| 6,814,642 B2 * | 11/2004 | Siwinski | G06F 3/041 445/24 |
| 8,094,129 B2 * | 1/2012 | Izadi | G06F 3/0421 178/18.09 |
| 8,144,115 B2 * | 3/2012 | Konicek | G06F 3/0412 345/104 |

(Continued)

OTHER PUBLICATIONS

Kim et al., IEEE Publication, Oct. 2011, "A highly sensitive capacitive touch sensor integrated on a thin film encapsulated active matrix OLED for ultrathin displays" (pp. 3609-3615).*

*Primary Examiner* — Manav Seth
(74) *Attorney, Agent, or Firm* — Platinum Intellectual Property LLP

(57) ABSTRACT

An organic light-emitting diode display panel for fingerprint recognition includes a glass substrate, a pixel layer, and a transparent substrate, which are laminated; the pixel layer includes a plurality of pixel units arranged on the glass substrate in arrays, wherein the plurality of pixel units are configured to emit light of multiple colors which are combined to form a colorful image; the transparent substrate includes a first side and a second side, which are disposed opposite to each other, the first side is fitted on the pixel layer, a plurality of light receiving units are arranged on a surface of the second side, and an orthographic projection of each light receiving unit on the transparent substrate is located in a gap between the adjacent pixel units. An electronic device is also provided.

20 Claims, 5 Drawing Sheets

(56) References Cited

U.S. PATENT DOCUMENTS

| | | | | |
|---|---|---|---|---|
| 8,520,176 | B2* | 8/2013 | Lin | G02B 27/26 349/117 |
| 8,724,038 | B2* | 5/2014 | Ganapathi | G02B 26/0833 345/173 |
| 8,743,082 | B2* | 6/2014 | Ganapathi | G02B 26/0833 178/18.01 |
| 8,767,157 | B2* | 7/2014 | Choi | G02F 1/134363 349/141 |
| 8,885,018 | B2* | 11/2014 | Smith | G02B 27/2214 348/42 |
| 8,963,886 | B2* | 2/2015 | Wassvik | G06F 3/042 178/18.09 |
| 9,122,349 | B1* | 9/2015 | Chang | G09G 3/3413 |
| 9,183,779 | B2* | 11/2015 | Soto | G06F 3/0412 |
| 9,262,003 | B2* | 2/2016 | Kitchens | G06F 3/0414 |
| 9,836,165 | B2* | 12/2017 | Nho | G06F 3/0421 |
| 2004/0252867 | A1* | 12/2004 | Lan | G06K 9/0004 382/124 |
| 2010/0265187 | A1* | 10/2010 | Chang | G06F 3/044 345/173 |
| 2012/0090757 | A1* | 4/2012 | Buchan | G02B 26/0833 156/60 |
| 2014/0159047 | A1* | 6/2014 | Wang | H01L 29/4908 257/75 |
| 2014/0293162 | A1* | 10/2014 | Park | G02F 1/133502 349/12 |
| 2015/0169136 | A1* | 6/2015 | Ganti | B06B 1/0666 345/177 |
| 2015/0331508 | A1* | 11/2015 | Nho | G06F 3/0421 345/173 |
| 2016/0078270 | A1* | 3/2016 | Lee | G06K 9/0008 382/125 |
| 2016/0079314 | A1* | 3/2016 | Seo | H01L 51/0054 257/40 |
| 2016/0266695 | A1* | 9/2016 | Bae | G06F 1/1643 |

* cited by examiner

ORGANIC LIGHT-ENITTING DIODE DISPLAY PANEL FOR FINGERPRINT RECOGNITION AND ELECTRONIC DEVICE

CROSS REFERENCE TO RELATED APPLICATION

This application claims priority to Chinese Patent Application No. 201611062840.6, entitled "ORGANIC LIGHT-EMITTING DIODE DISPLAY SCREEN FINGERPRINT RECOGNITION EQUIPMENT AND ELECTRONIC DEVICE" filed on Nov. 28, 2016, the contents of which are expressly incorporated by reference herein in its entirety.

FIELD OF THE INVENTION

The present disclosure relates to the field of display technology, and more particularly relates to an organic light-emitting diode (OLED) display panel for fingerprint recognition and an electronic device having the same.

BACKGROUND OF THE INVENTION

The OLED display device has advantages of high luminous efficiency, fast response time, being more flexible, emitting light without backlight, thus being applied widely. At the same time, with the rise of the fingerprint recognition technology, the developers begin to research how to apply the fingerprint recognition technology to the OLED display device, so as to enhance safety and operability thereof.

A conventional capacitance fingerprint sensing device is separately arranged for fingerprint recognition in non-display area of the OLED display device. The capacitance fingerprint sensing device has a complicated structure needed to be disposed in non-display area of the display device, which enlarges the non-display area and has an influence on the overall structure of the display device, and OLED display technology cannot integrate with the fingerprint recognition technology to achieve the full-screen fingerprint recognition.

SUMMARY

The present disclosure is directed to an OLED display panel for fingerprint recognition and an electronic device having the same.

The OLED display panel for fingerprint recognition includes a glass substrate, a pixel layer, and a transparent substrate, which are laminated; the pixel layer includes a plurality of pixel units arranged on the glass substrate in arrays, wherein the plurality of pixel units are configured to emit light of multiple colors which are combined to form a colorful image; the transparent substrate has opposed first side and second side, the first sides is attached to the pixel layer, a plurality of light receiving units are arranged on a surface of the second side, and an orthographic projection of each light receiving unit on the transparent substrate is located in a gap between the adjacent pixel units.

An electronic device includes the OLED display panel for fingerprint recognition and a motherboard electrically coupled to the OLED display panel, the motherboard is configured to control the pixel unit to display image and process a fingerprint signal sent from the light receiving unit.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. The accompanying drawings in the following description are only some embodiments of the present invention, and persons of ordinary skill in the art can derive other obvious variations from the accompanying drawings without creative efforts.

DETAILED DESCRIPTION OF THE EMBODIMENTS

The accompanying drawings according to the embodiments of the present disclosure will be described in the following to illustrate the technical solutions according to the embodiments of the present disclosure more clearly and completely. The described implementations are merely specific embodiments of the present disclosure, and any implementations derived from the foregoing implementations without creative efforts by persons skilled in the art shall all fall within the protection scope of the present disclosure.

Figure 1:
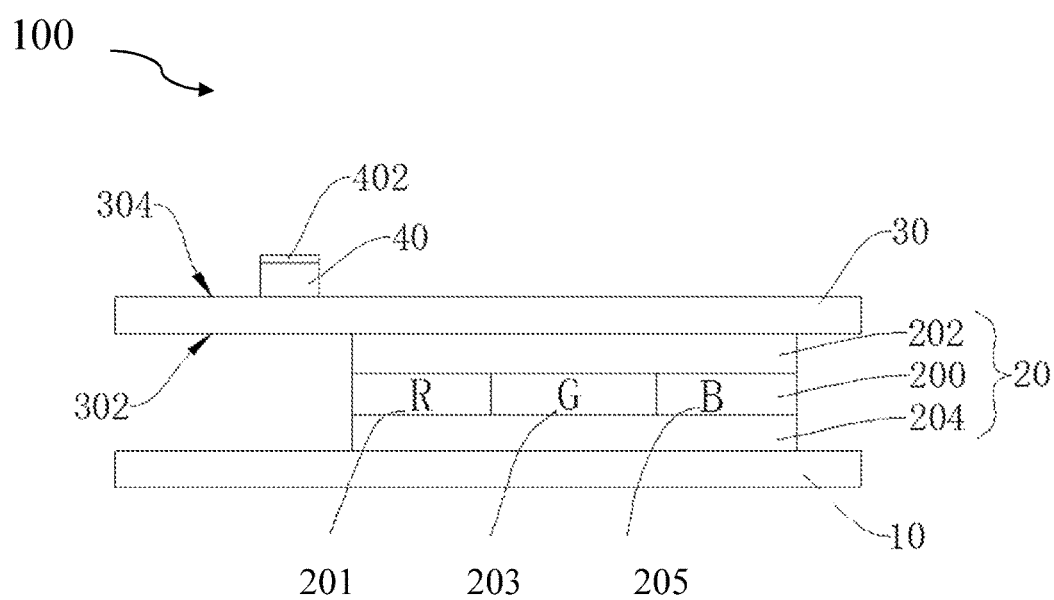
FIG. 1 is a cross-section view of an OLED display panel for fingerprint recognition according to a first embodiment.
Figure 2:
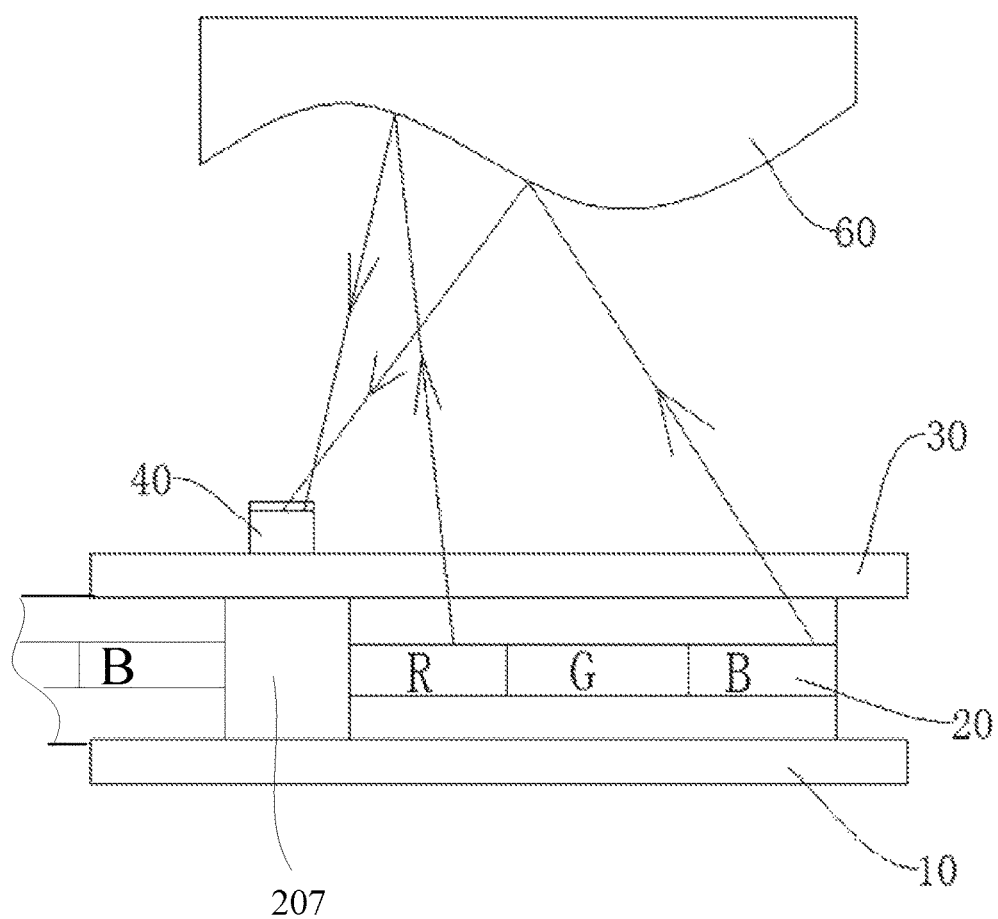
FIG. 2 is a principle diagram of the OLED display panel of FIG. 1.

Referring to FIGS. 1 and 2, an OLED display panel 100 according to an embodiment includes a glass substrate 10, a pixel layer, and a transparent substrate 30, which are laminated. The pixel layer includes a plurality of pixel units 20 arranged on the glass substrate 10 in arrays. For clarity, only one pixel unit 20 is showed in the drawings, while the other pixel units having a similar structure and function as that of the pixel unit 20 are omitted. The plurality of pixel units 20 are used to emit light of multiple colors. A pixel is formed by the pixel unit 20 according to the light of red, green and blue with different brightness. A plurality of pixels formed by the pixel units 20 are combined to form a colorful image.

In the illustrated embodiment, the pixel unit 20 includes a mental cathode 202, a mental anode 204, and an organic luminescent layer 200 which is sandwiched between the mental cathode 202 and the mental anode 204. The organic luminescent layer 200 is used to control a brightness of the light emitted from the organic luminescent layer 200 according to a voltage applied between the mental cathode 202 and the mental anode 204. Specifically, the organic luminescent layer 200 may include an electron transmission layer, an electron injection layer, a luminescent material layer, a hole injection layer, and a hole transmission layer, which are sequentially laminated, thus forming a P-N junction. In the pixel unit 20, the organic luminescent layer 200 is provided with the mental cathode 202 and the mental anode 204 connecting to the P-N junction in the forward direction on both sides, respectively, so as to form the OLED to emit light and display. The organic luminescent layer 200 emits light of three primary colors of red, green and blue according to the different ratio of the luminescent material.

The organic luminescent layer 200 includes a red sub-pixel unit 201, a green sub-pixel unit 203, and a blue sub-pixel unit 205, which are arranged in parallel on the mental anode 204. The red sub-pixel unit 201 is used to emit the red light, the green sub-pixel unit 203 is used to emit the green light, and the blue sub-pixel unit 205 is used to emit the blue light. Each sub-pixel unit emits light of one color. Specifically, the light emitting unit 50 displays the image by self-luminous characteristic of the organic luminescent layer 200 without need for a backlight. The red light, the green light, and the blue light are combined to form the colorful image. Thus the OLED display panel 100 has advantages of a wide viewing angle, almost infinite high contrast, lower power consumption, fast response time and so on.

The transparent substrate 30 has a first side 302 and a second side 304, which are opposite to each other. The first side 302 is attached to the pixel layer, the second side 304 is provided with a plurality of light receiving units 40 on a surface thereof. An orthographic projection of each light receiving unit 40 on the transparent substrate 30 is located in a gap 207 between the adjacent pixel units 20. The light receiving units 40 will not block the pixel unit 20, thus a user is able to observe the colorful image that is formed by the image light emitted from the pixel unit 20. When the user operates on the display panel 100 with a finger, partial light emitted from the pixel unit 20 will be reflected by the finger. Since the valley and the ridge of fingerprint have different reflection characteristics of light, the light intensity reflected into the light receiving unit 40 corresponding to the valley and ridge of fingerprint are different, therefore the light receiving unit 40 generates different current. The valley or ridge of the fingerprint can be determined by analyzing the current of the light receiving unit 40, thus the image of the fingerprint can be obtained.

In the illustrated embodiment, the transparent substrate 30 is made of glass or polymethyl methacrylate with high transmittance, As a component connecting the light receiving unit 40 and the pixel unit 20, the transparent substrate 30 made of glass or polymethyl methacrylate can reduce the loss of the light emitted from the pixel unit 20, thus improving the accuracy of the fingerprint recognition.

In the illustrated embodiment, the OLED display panel 100 further includes a filter 402 located on a surface of the light receiving unit 40 away from the transparent substrate 30. The filter 402 allows only the light of a first wavelength to pass, thereby enabling the light receiving unit 40 to sense the light of the first wavelength. For example, the first wavelength can be a wavelength of red light, the filter 402 allows only the red light to pass, and the light receiving unit 40 receives and senses only the intensity of the red light. The valley or ridge of the fingerprint can be determined by analyzing the intensity of the red light emitted from the pixel unit 20 and the intensity of the red light reflected by the finger and received by the light receiving unit 40, thus the image of the fingerprint can be obtained. The light of the particular wavelength can be obtained by using the filter 402, and the image of the fingerprint is identified more precisely by the intensity before and after reflection of the light of the particular wavelength on the finger 60.

Figure 3:
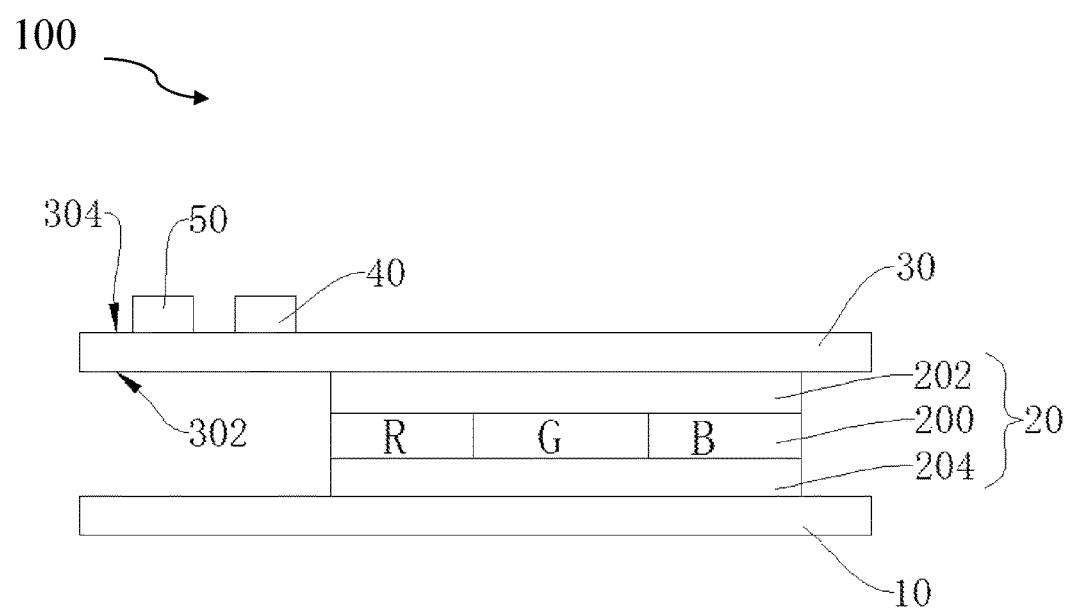
FIG. 3 is a cross-section view of the OLED display panel for fingerprint recognition according to a second embodiment.
Figure 4:
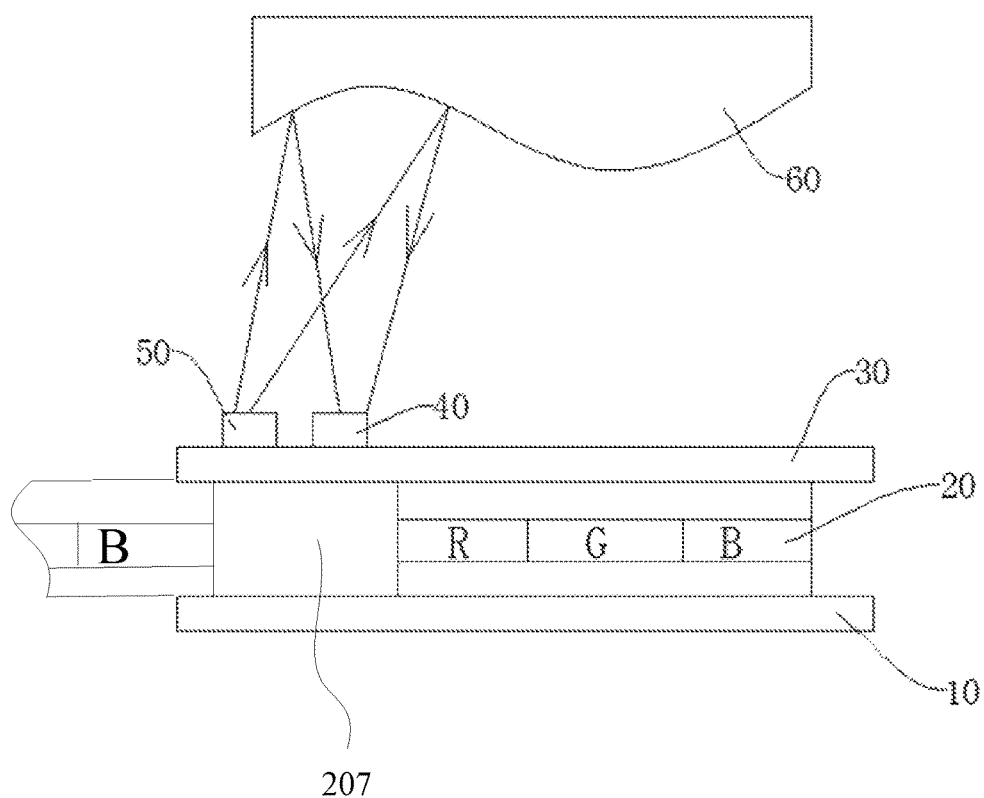
FIG. 4 is a principle diagram of the OLED display panel of FIG. 3.

Referring to the FIGS. 3 and 4, the OLED display panel 100 according to a second embodiment has a similar structure as that of the first embodiment, the difference lies on that the OLED display panel 100 further includes a plurality of light emitting units 50. The plurality of light emitting units 50 are arranged on the surface of the second side 304, and an orthographic projection of each light emitting unit 50 on the transparent substrate 30 is located in the gap 207 between the adjacent pixel units 20. In one embodiment, the light emitting unit 50 and the light receiving unit 40 are arranged adjacent to each other on the transparent substrate 30.

In one embodiment, the light emitting unit 50 is an infrared emitter, and the light receiving unit 40 is an infrared photodiode configured to sense infrared light emitted from the infrared emitter. A infrared light emitted from the light emitting unit 50 being reflected by the finger will be received by the light receiving unit 40. The light receiving unit 40 recognizes the fingerprint with optical fingerprint recognition technology, thus the OLED display technology is integrated with the fingerprint recognition technology. The plurality of pixel units 20 are arranged in arrays to form the OLED display panel 100 to achieve the full-screen fingerprint recognition, the structure of which is simple and the fingerprint recognition is accurate, which satisfies the requirement of full-screen fingerprint recognition of the OLED display panel 100.

In an alternative embodiment, the light emitting unit 50 is a visible light emitter configured to emit sensing light of a second wavelength, and the light receiving unit 40 is the photodiode configured to sense the sensing light and the light of the first wavelength. When the component material of the photodiode varies, it can sense different light with particular wavelength. The photodiode can receive the sensing light emitted from the light emitting unit 50, as well as the light contained in the light emitted from the pixel unit 20, which has the same wavelength as the sensing light. The more light photodiode receives, the better fingerprint recognition is, so as to enable the OLED display technology to integrate with the fingerprint recognition technology and the OLED display panel 100 to achieve the full-screen fingerprint recognition.

In an alternative embodiment, the light emitting unit 50 is the visible light emitter configured to emit the sensing light of a third wavelength, the filter 402 is disposed on the surface of the light receiving unit 40. The filter 402 allows only the sensing light and the light of the third wavelength to pass. The light receiving unit 40 is the photodiode configured to sense the sensing light and the light of the third wavelength. In the illustrated embodiment, the photodiode does not need to be made up of a specific material, and the filter 402 has a function of enabling the light receiving unit 40 to sense light of the particular wavelength. The filter 402 filters the light received by the light receiving unit 40 through the filter 402 so that the light receiving unit 40 receives only the light of the particular wavelength. For example, when the filter 402 allowing the red light wavelength to pass is selected, by means of analyzing the intensity of the red light and the sensing light and the intensity of the red light received by the light receiving unit 40, what the red light corresponds to the valley or ridge of the fingerprint can be informed. The usage of the filter 402 can reduce the requirement of the photodiode and eliminates the need to use photodiode materials that can merely sense the particular wavelength, thereby reducing the cost of the device.

According to the display panel 100, the pixel unit 20 emits light to display the image, partial light reflected by the finger will be received by the light receiving unit 40, and the light receiving unit 40 can recognize the fingerprint with optical fingerprint recognition technology. The light receiving unit 40 is located in the gap 207 between the adjacent pixel units 20 without having an influence on displaying the image by the pixel units 20. Thus the OLED display technology is integrated with the fingerprint recognition technology. The plurality of pixel units 20 are arranged in arrays to form the OLED display panel 100 to achieve the full-screen fingerprint recognition, the structure of which is simple and the fingerprint recognition is accurate, which satisfies the requirement of full-screen fingerprint recognition of the OLED display panel 100.

Figure 5:
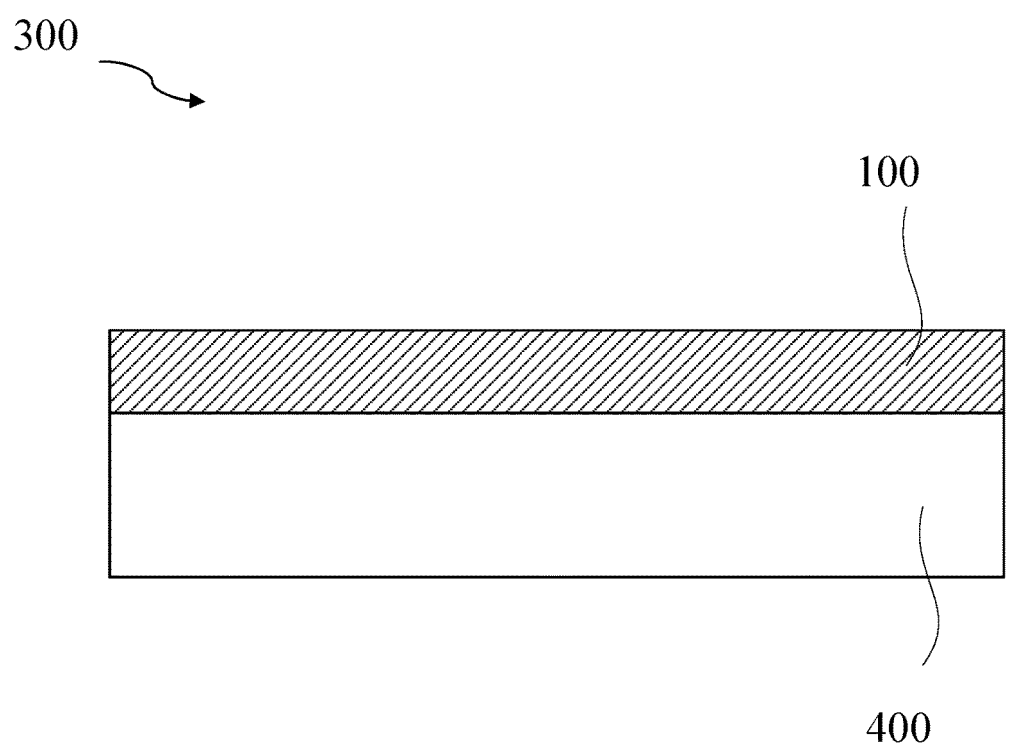
FIG. 5 is a cross-section view of an electronic device according to an embodiment.

Referring to FIG. 5, in one embodiment, an electronic device 300 is provided which includes a motherboard 400 and the foregoing OLED display panel 100. The motherboard 400 is electronically coupled to the OLED display panel 100 and is used to control the pixel unit 20 to display image and process the fingerprint signal emitted from the light receiving unit 40. In one embodiment, the electronic device 300 may be a terminal with the OLED panel having the fingerprint recognition function, the terminal may be a mobile phone, a tablet, PDA (Personal Digital Assistant), ATM (Automatic Teller Machine) and so on.

The foregoing implementations are merely specific embodiments of the present disclosure, but are not intended to limit the protection scope of the present disclosure. It should be noted that persons skilled in the art can understand and embody all or part of flowcharts of the above implementations. Equivalent variation figured out by persons skilled in the art shall all fall within the protection scope of the present disclosure.

What is claimed is:

1. An organic light-emitting diode (OLED) display panel for fingerprint recognition, comprising:
    a glass substrate;
    a pixel layer comprising a plurality of pixel units arranged on the glass substrate in arrays, wherein the plurality of pixel units are configured to emit light of multiple colors which are combined to form a colorful image;
    a transparent substrate having opposed first and second sides, the first side being attached to the pixel layer; and
    a plurality of light receiving units arranged on the second side, wherein an orthographic projection of each light receiving unit on the transparent substrate is located in a gap between the adjacent pixel units.

2. The OLED display panel of claim 1, further comprising a filter located on a surface of the light receiving unit away from the transparent substrate, wherein the filter allows the light of a first wavelength to pass, thereby enabling the light receiving unit to sense the light of the first wavelength.

3. The OLED display panel of claim 1, further comprising a plurality of light emitting units arranged on the second side, wherein an orthographic projection of each light emitting unit on the transparent substrate is located in the gap between the adjacent pixel units.

4. The OLED display panel of claim 3, wherein the light emitting unit is an infrared emitter, and the light receiving unit is an infrared photodiode configured to sense infrared light emitted from the infrared emitter.

5. The OLED display panel of claim 3, wherein the light emitting unit is a visible light emitter configured to emit sensing light of a second wavelength, and the light receiving unit is a photodiode configured to sense the sensing light and the light of a first wavelength.

6. The OLED display panel of claim 3, wherein the light emitting unit is a visible light emitter configured to emit sensing light of a third wavelength; the OLED display panel further comprises a filter located on a surface of the light receiving unit, the filter allows the sensing light and light of the third wavelength to pass; the light receiving unit is a photodiode configured to sense the sensing light and the light of the third wavelength.

7. The OLED display panel of claim 3, wherein the light emitting unit and the light receiving unit are arranged adjacent to each other on the transparent substrate.

8. The OLED display panel of claim 1, wherein the transparent substrate is made of glass.

9. The OLED display panel of claim 1, wherein the transparent substrate is made of polymethyl methacrylate.

10. The OLED display panel of claim 1, wherein the pixel unit comprises a mental cathode, a mental anode, and an organic luminescent layer sandwiched between the mental cathode and the mental anode; the organic luminescent layer is configured to control a brightness of the light emitted from the organic luminescent layer according to a voltage applied between the mental cathode and the mental anode.

11. The OLED display panel of claim 10, wherein the organic luminescent layer comprises a red sub-pixel unit, a green sub-pixel unit, and a blue sub-pixel unit, which are arranged in parallel on the mental anode; the red sub-pixel unit is configured to emit red light, the green sub-pixel unit is configured to emit green light, and the blue sub-pixel unit is configured to emit the blue light.

12. The OLED display panel of claim 10, wherein the organic luminescent layer comprises an electron transmission layer, an electron injection layer, a luminescent material layer, a hole injection layer, and a hole transmission layer, which are sequentially laminated.

13. An electronic device, comprising:
    an OLED display panel comprising:
        a glass substrate;
        a pixel layer comprising a plurality of pixel units arranged on the glass substrate in arrays, wherein the plurality of pixel units are configured to emit light of multiple colors which are combined to form a colorful image;
        a transparent substrate having opposed first and second sides, the first side being attached to the pixel layer; and
        a plurality of light receiving units arranged on a surface of the second side, wherein an orthographic projection of each light receiving unit on the transparent substrate is located in a gap between the adjacent pixel units; the glass substrate, the pixel layer and the transparent substrate are laminated; and
    a motherboard electrically coupled to the OLED display panel, wherein the motherboard is configured to control the pixel unit to display image and process a fingerprint signal sent from the light receiving unit.

14. The electronic device of claim 13, further comprising a filter located on a surface of the light receiving unit away from the transparent substrate, wherein the filter allows the light of a first wavelength to pass, thereby enabling the light receiving unit to sense the light of the first wavelength.

15. The electronic device of claim 13, further comprising a plurality of light emitting units arranged on the surface of the second side, wherein an orthographic projection of each light emitting unit on the transparent substrate is located in the gap between the adjacent pixel units.

16. The electronic device of claim 15, wherein the light emitting unit is an infrared emitter, and the light receiving unit is an infrared photodiode configured to sense infrared light emitted from the infrared emitter.

17. The electronic device of claim 15, wherein the light emitting unit is a visible light emitter configured to emit sensing light of a second wavelength, and the light receiving unit is a photodiode configured to sense the sensing light and the light of a first wavelength.

18. The electronic device of claim 15, wherein the light emitting unit is the visible light emitter configured to emit sensing light of a third wavelength; the OLED display panel further comprises a filter located on a surface of the light receiving unit, the filter allows the sensing light and light of the third wavelength to pass; the light receiving unit is a photodiode configured to sense the sensing light and the light of the third wavelength.

19. The electronic device of claim 15, wherein the light emitting unit and the light receiving unit are arranged adjacent to each other on the transparent substrate.

20. The electronic device of claim 13, wherein the pixel unit comprises a mental cathode, a mental anode, and an organic luminescent layer sandwiched between the mental cathode and the mental anode; the organic luminescent layer is configured to control a brightness of the light emitted from the organic luminescent layer according to a voltage applied between the mental cathode and the mental anode.

* * * * *